United States Patent
Choi et al.

(10) Patent No.: US 10,241,628 B2
(45) Date of Patent: Mar. 26, 2019

(54) TOUCH PANEL, MANUFACTURING METHOD THEREOF, AND DISPLAY DEVICE

(71) Applicant: BOE TECHNOLOGY GROUP CO., LTD., Beijing (CN)

(72) Inventors: Seungjin Choi, Beijing (CN); Jing Niu, Beijing (CN); Shuang Sun, Beijing (CN); Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 71 days.

(21) Appl. No.: 14/770,151

(22) PCT Filed: Dec. 1, 2014

(86) PCT No.: PCT/CN2014/092701
§ 371 (c)(1),
(2) Date: Aug. 25, 2015

(87) PCT Pub. No.: WO2016/026236
PCT Pub. Date: Feb. 25, 2016

(65) Prior Publication Data
US 2016/0253027 A1    Sep. 1, 2016

(30) Foreign Application Priority Data

Aug. 22, 2014 (CN) .......................... 2014 1 0419265

(51) Int. Cl.
*G06F 3/044* (2006.01)
*G03F 7/20* (2006.01)
(Continued)

(52) U.S. Cl.
CPC ............... *G06F 3/044* (2013.01); *G03F 7/20* (2013.01); *G03F 7/32* (2013.01); *G06F 3/0412* (2013.01);
(Continued)

(58) Field of Classification Search
CPC ......... G02F 1/133345; G02F 1/134309; G02F 1/13338; G02F 2001/136236;
(Continued)

(56) References Cited

U.S. PATENT DOCUMENTS 5,045,798 A * 9/1991 Hendrick ........... G01R 27/2635
324/685
7,834,360 B2 * 11/2010 Choi ..................... H01L 27/124
257/258
(Continued)

FOREIGN PATENT DOCUMENTS

| CN | 102654807 A | 9/2012 |
| CN | 203422734 U | 2/2014 |
| CN | 103870075 A | 6/2014 |

OTHER PUBLICATIONS

First Chinese Office Action dated Sep. 6, 2016; Appln. No. 201410419265.5.
(Continued)

*Primary Examiner* — Sanjiv D. Patel
(74) *Attorney, Agent, or Firm* — Ladas & Parry LLP (57) ABSTRACT

A touch panel, a manufacturing method thereof and a display device are provided. The touch panel includes a first touch electrode, a second touch electrode and a one-piece insulating element. The second touch electrode includes an electrode section disposed in a same layer as the first touch electrode and a connecting section under the electrode section. The electrode section includes a first electrode section and a second electrode section, which are electrically connected by the connecting section, and the connecting section is spaced apart from the first touch electrode. The insulating element includes a first insulating section between the connecting section and the first touch electrode and a second insulating section between the first electrode section and the first touch electrode and also between the second
(Continued)

electrode section and the first touch electrode. The insulating sections can be obtained by performing a patterning process, so that the manufacturing method of the touch panel is simplified.

19 Claims, 4 Drawing Sheets (51) Int. Cl.
    *G03F 7/32* (2006.01)
    *G06F 3/041* (2006.01)
(52) U.S. Cl.
    CPC .. *G06F 3/0416* (2013.01); *G06F 2203/04103* (2013.01); *G06F 2203/04111* (2013.01)
(58) Field of Classification Search
    CPC ....... G02F 1/1362; G02F 2001/136231; G06F 2203/04111; G06F 2203/04103; G06F 2203/04112; G06F 3/0412; G06F 3/041–3/048
    See application file for complete search history.

(56) References Cited

U.S. PATENT DOCUMENTS

| | | | | |
|---|---|---|---|---|
| 2010/0007616 A1* | 1/2010 | Jang | ................... | G06F 3/0412 345/173 |
| 2010/0182259 A1* | 7/2010 | Jung | ................... | G06F 3/044 345/173 |
| 2011/0069033 A1* | 3/2011 | Meng | ................... | G06F 3/044 345/174 |
| 2011/0273398 A1* | 11/2011 | Ho | ................... | G06F 3/044 345/174 |
| 2012/0081300 A1 | 4/2012 | Chan et al. | | |
| 2013/0045602 A1* | 2/2013 | Lu | ................... | H01L 21/31144 438/700 |
| 2013/0082944 A1* | 4/2013 | Juan | ................... | G06F 3/0412 345/173 |
| 2014/0063097 A1* | 3/2014 | Liu | ................... | G06F 3/041 347/12 |
| 2014/0160373 A1* | 6/2014 | Hsu | ................... | G06F 3/044 349/12 |
| 2015/0029423 A1* | 1/2015 | Huang | ................... | G06F 3/047 349/12 |

OTHER PUBLICATIONS

International Search Report and Written Opinion both dated May 13, 2015; PCT/CN2014/092701.

Second Chinese Office Action dated Jan. 24, 2017; Appln. No. 201410419265.5.

* cited by examiner

TOUCH PANEL, MANUFACTURING METHOD THEREOF, AND DISPLAY DEVICE

TECHNICAL FIELD

Embodiments of the present invention relate to a touch panel, a manufacturing method thereof and a display device.

BACKGROUND

Figure 1:
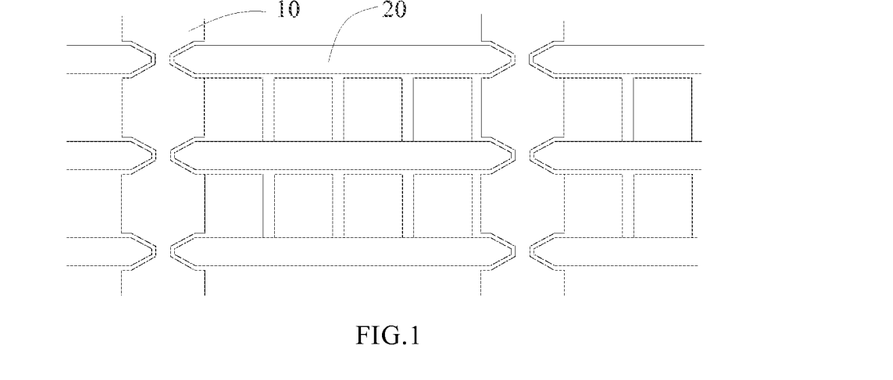
FIG. 1 is a top view of a touch panel.
Figure 2:
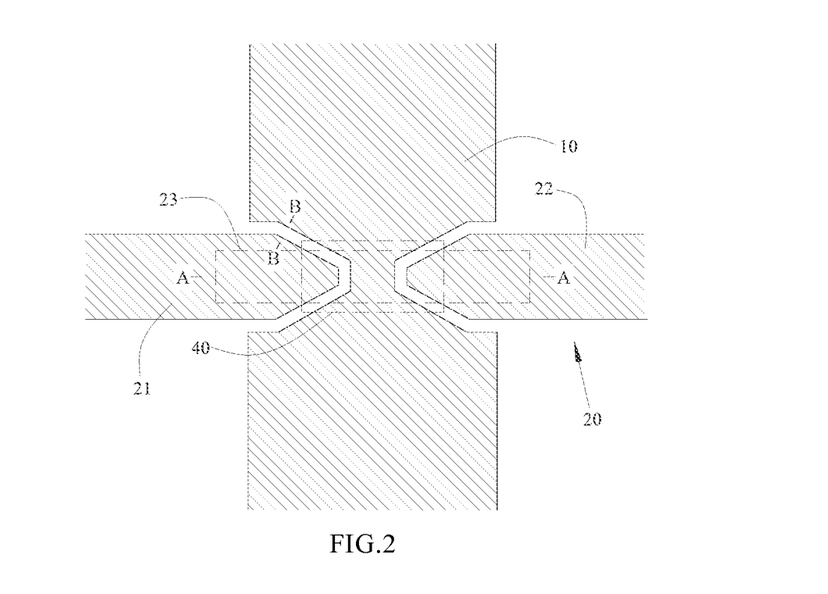
FIG. 2 is a partial enlarged view of the touch panel in FIG. 1, in which the second insulating layer is not shown in the structure shown in FIG. 2.
Figure 3:
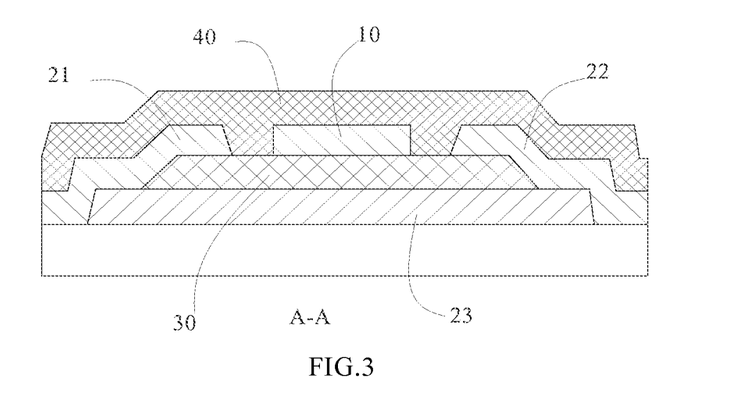
FIG. 3 shows the sectional view along line A-A of the structure in FIG. 2, in which the second insulating layer is included in the structure shown in FIG. 3.

FIGS. 1 to 3 show schematic diagrams of an OGS (One Glass Solution) touch panel. As shown in the top view in FIG. 1, the touch panel includes a plurality of first touch electrodes 10 and a plurality of second touch electrodes 20; the first touch electrodes 10 and the second touch electrodes 20 are disposed intersecting with each other and insulated from each other. The second touch electrodes 20 each comprise an electrode section disposed in the same layer as the first touch electrode 10 and a connecting section 23 disposed under the electrode section. As shown in the partial enlarged view in FIG. 2, the electrode section includes a first electrode section 21 on the left of the first touch electrode 10 and a second electrode section 22 on the right of the first touch electrode 10; the first electrode section 21 and the second electrode section 22 are electrically connected by the connecting section 23, and the connecting section 23 is disposed apart from the first touch electrode 10. Moreover, as shown in the sectional view in FIG. 3 along line A-A in FIG. 2, the touch panel further includes a first insulating layer 30 and a second insulating layer 40, and the first insulating layer 30 is between the first touch electrode 10 and the connecting section 23, and the second insulating layer 40 covers the first touch electrode 10 and the electrode section of the second touch electrode, and has a part disposed in the space between the first touch electrode 10 and the first electrode section 21 and another part disposed in the space between the first touch electrode 10 and the second electrode section 22.

The first insulating layer 30 is mainly configured to separate the first touch electrode 10 from the second touch electrode 20, while the second insulating layer 40 is mainly configured to reduce capacitance between the first touch electrode 10 and the second touch electrode 20.

SUMMARY

At least one embodiment of the present invention provides a touch panel, a manufacturing method of the touch panel and a display device including the touch panel.

At least one embodiment of the present invention provides a touch panel. The touch panel includes a first touch electrode, a second touch electrode and a one-piece insulating element therebetween. The first touch electrode and the second touch electrode are disposed intersecting with each other and insulated from each other. The second touch electrode includes an electrode section disposed in a same layer as the first touch electrode and a connecting section disposed on a different layer and spaced apart from the electrode section. The electrode section includes a first electrode section on one side in a widthwise direction of the first touch electrode and a second electrode section on the other side in the widthwise direction, which are electrically connected by the connecting section, and the connecting section is disposed on a different layer and spaced apart from the first touch electrode. The insulating element includes a first insulating section between the connecting section and the first touch electrode and the second insulating section between the first electrode section and the first touch electrode and also between the second electrode section and the first touch electrode.

For example, an of the connecting section in the widthwise direction of the first touch electrode goes beyond an edge of the first insulating section in the widthwise direction, so that a part of the first electrode section is electrically connected to the part of the connecting section beyond the first insulating section and on the same side as the first electrode section, and a part of the second electrode section is electrically connected to the part of connecting section beyond the first insulating section and on the same side as the second electrode section.

At least one embodiment of the present invention provides a manufacturing method. The manufacturing method includes: forming a pattern including a connecting section; forming a pattern including an insulating element, the insulating element including a first insulating section and a second insulating section protruding from the first insulating section; and forming a pattern including an electrode section and a first touch electrode. The electrode section includes a first electrode section and a second electrode section, which are electrically connected by the connecting section so as to form a second touch electrode; the first insulating section is between the connecting section and the first touch electrode, and the second insulating section is between the first electrode section and the first touch electrode and also between the second electrode section and the first touch electrode.

For example, an edge of the connecting section in the widthwise direction of the first touch electrode goes beyond an edge of the first insulating section in the direction, so that a part of the first electrode section is electrically connected to the part of the connecting section beyond the first insulating section and on the same side as the first electrode section, and a part of the second electrode section is electrically connected to the part of the connecting section beyond the first insulating section and on the same side as the second electrode section.

For example, forming of the pattern including the insulating element includes: forming a layer of insulating material; applying photoresist onto the layer of insulating material; and exposing and developing the photoresist with a halftone mask plate so as to form a pattern corresponding to the insulating element in the layer of photoresist after exposure, wherein the halftone mask plate comprises an opaque area corresponding to the second insulating sections and a partially transparent area corresponding to the first insulating sections, and a rest part of the halftone mask plate other than the opaque area and the partially transparent area is a transparent area.

For example, the layer of insulating material is made of a transparent resin material.

For example, forming of the pattern comprising the electrode section and the first touch electrode includes: forming a layer of electrode material covering the insulating element; forming a layer of photoresist covering the layer of electrode material; exposing and developing the layer of photoresist so as to form the pattern corresponding to the first touch electrode and the pattern corresponding to the electrode section; and etching the layer of electrode material according to the pattern corresponding to the first touch electrode and the pattern corresponding to the electrode section formed in the layer of photoresist so as to form the first touch electrode and the electrode section.

For example, the layer of electrode material is made of a transparent electrode material.

At least one embodiment of the present invention provides a display device including a display panel and a touch panel disposed on a light-emitting surface of the display panel; the touch panel is the above-mentioned touch panel provided in at least one embodiment of the present invention.

For example, the upper substrate of the display panel is integrated with the base substrate of the touch panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

| 10: First touch electrode | 20: Second touch electrode |
|---|---|
| 21: First electrode section | 22: Second electrode section |
| 23: Connecting section | 30: First insulating layer |
| 40: Second insulating layer | 50: Insulation piece |
| 51: First insulating section | 52: Second insulating section |
| 100: Touch panel | 200: Display panel |

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the embodiments to be described are only some, not all, of the embodiments of the present invention. Based on the described embodiments herein, those skilled in the art can obtain other embodiment(s), without any inventive work, which should be within the scope of the invention.

Figure 4:
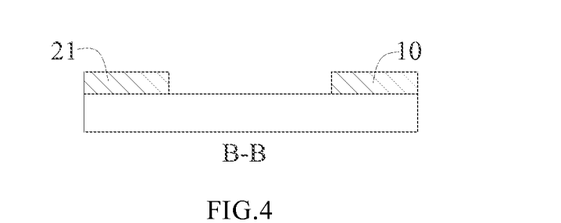
FIG. 4 shows the sectional view along line B-B of the structure in FIG. 2 before the formation of the second insulating layer.

The touch panel shown in FIGS. 1 to 3 is manufactured in the following sequence: the connecting section 23 is first formed; next the first insulating layer 30 is formed; then the first touch electrode 10 and the electrode section of the second touch electrode 20 are formed. FIG. 4 is the sectional view, along line B-B, of the structure in FIG. 2 before the formation of the second insulating layer. As seen from FIG. 4, after the formation of the first insulating layer 30, because the second insulating layer 40 is not formed between the first touch electrode 10 and the electrode section of the second touch electrode 20, another step is needed to form the second insulating layer. It can be seen that the fabrication process of the touch panel is relatively complex.

Figure 5:
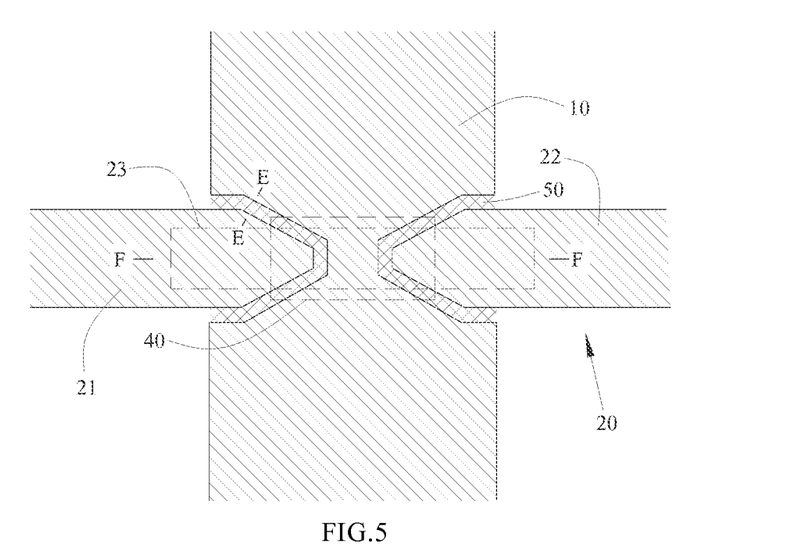
FIG. 5 is a partial top view of a touch panel provided in an embodiment of the present invention.
Figure 6:
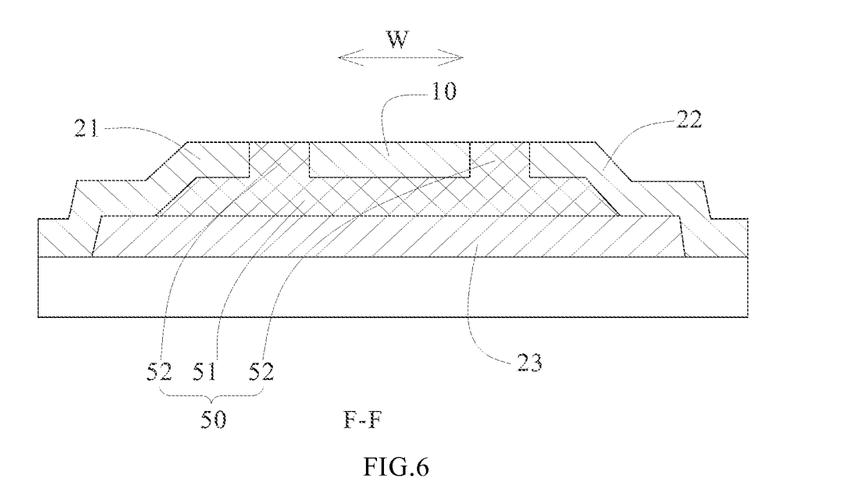
FIG. 6 is a sectional view along line F-F of the structure in FIG. 5.
Figure 7A:
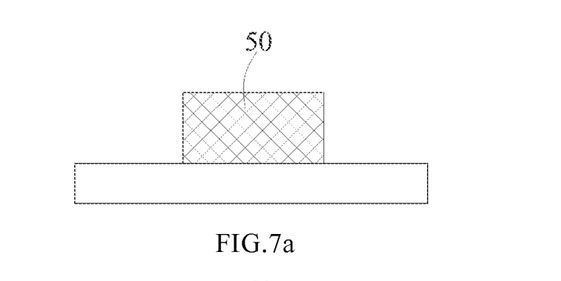
FIG. 7a is a schematic diagram illustrating the step for forming an insulating element.
Figure 7B:
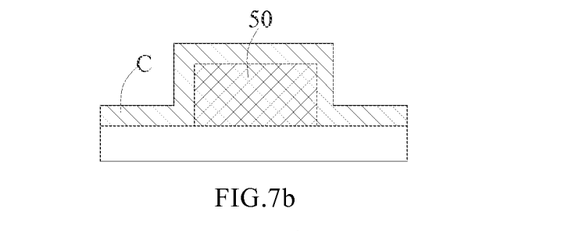
FIG. 7b is a schematic diagram illustrating the step for forming a layer of electrode material.
Figure 7C:
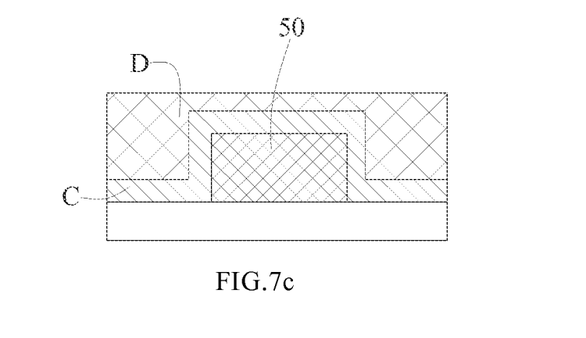
FIG. 7c is a schematic diagram illustrating the step for forming a layer of photoresist.
Figure 7D:
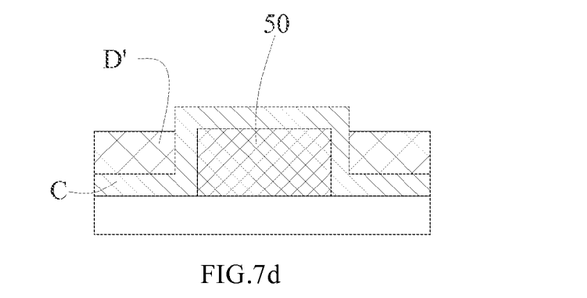
FIG. 7d is a schematic diagram illustrating the step for exposing and developing the photoresist.
Figure 7E:
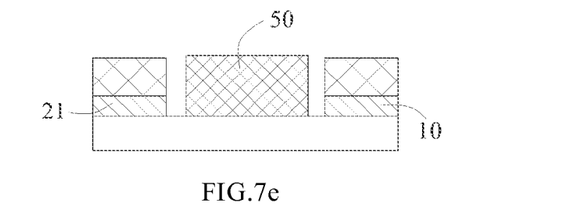
FIG. 7e is a schematic diagram illustrating the step for etching the layer of electrode material.
Figure 7F:
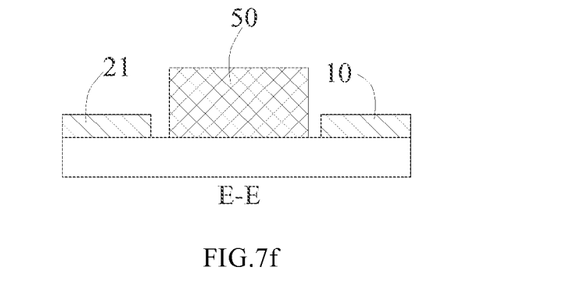
FIG. 7f is a partial sectional view of the touch panel formed after the photoresist is stripped off.
Figure 8:
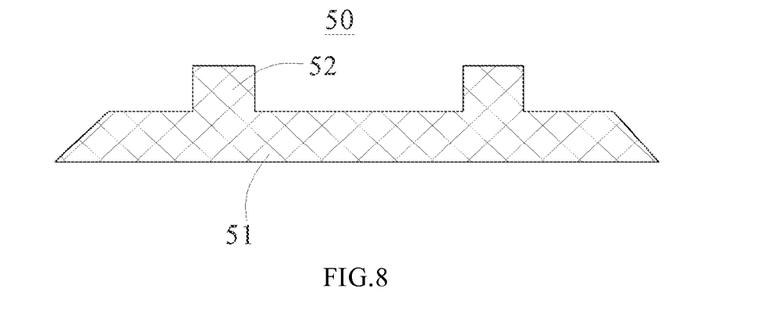
FIG. 8 is a sectional view of an insulating element according to an embodiment of the present invention.

It is to be understood that, as used herein, the directional terms "left" and "right" refer to the left and right directions in FIGS. 5 to 8, and the directional terms "up" and "down" refer to the top and bottom directions in FIGS. 6 to 8.

As shown in FIG. 5, at least one embodiment of the present invention provides a touch panel including a plurality of parallel first touch electrodes 10 and a plurality of parallel second touch electrodes 20. Only one first touch electrode 10 and one second touch electrode 20 are shown in the drawing. The first touch electrode 10 and the second touch electrode 20 are disposed intersecting with each other and insulated from each other. The second touch electrode 20 includes an electrode section disposed in the same layer as the first touch electrode 10 and a connecting section 23 spaced apart from the electrode section by a layer. The electrode section includes a first electrode section 21 on one side, in the widthwise direction, of the first touch electrode 10 (the left side in FIG. 5) and a second electrode section 22 on the other side, in the widthwise direction, of the first touch electrode 10 (the right side in FIG. 5). The first electrode section 21 and the second electrode section 22 are electrically connected by the connecting section 23, and the connecting section 23 is disposed spaced apart from the first touch electrode 10. The touch panel further includes one-piece insulating elements 50 that are disposed between the first touch electrodes 10 and the second touch electrodes 20. As shown in FIG. 6 and FIG. 8, the insulating elements 50 each includes a first insulating section 51 between the connecting section 23 and the first touch electrode 10 and a second insulating section 52 between the first electrode section 21 and the first touch electrode 10 and also between the second electrode section 22 and the first touch electrode 10.

The electrode sections 21, 22 being disposed spaced apart from the connecting section 23 by a layer means that the electrode sections and the connecting section are located in different layers and have a separation interlayer therebetween.

Since the insulating element 50 is in a one-piece structure, the insulating section 51 can be obtained by performing a patterning process, simplifying the manufacturing method of the touch panel.

In at least one embodiment of the present invention, the material, for the first touch electrode 10 and the second touch electrode 20, is not particularly limited. For example, both the first touch electrode 10 and the second touch electrode 20 can be made of a transparent electrode material (e.g., indium tin oxide (ITO)). Alternatively, at least one of the first touch electrode 10 and the second touch electrode 20 may be made of an opaque metallic material. In this case, with respect to position, the touch electrode made of a metallic material corresponds to the black matrix in the display panel used in coordination with the touch panel.

The insulating element 50 should be made of a transparent insulating material, e.g., a transparent resin material, such as epoxy resin, polystyrene resin or the like; in one example, the transparent resin material may have photosensitivity so as to be used directly in a photolithographic process. The first insulating section 51 is located between the connecting section 23 and the first touch electrode 10 to reduce capacitance therebetween, and the second insulating section 52 is located between the first electrode section 21 and the first touch electrode 10 to reduce capacitance between the first electrode section 21 and the first touch electrode 10 and also located between the second electrode section 22 and the first touch electrode 10 to reduce capacitance between the second electrode section 22 and the first touch electrode 10.

In at least one embodiment of the present invention, the electrode sections 21, 22 of the second touch electrode 20 are electrically connected with the connecting section 23. The electrical connection between the electrode sections 21, 22 of the second touch electrode 20 and the connecting section 23 may be implemented in various ways. For example, the electrode sections of the second touch electrode 20 may be connected to the connecting section 23 through via holes. For example, the first insulating section 51 of the insulating element 50 may be configured to have its border go beyond the connecting section 23 and have via holes disposed therein. Then, the electrode material for forming the first touch electrode 10 and the electrode sections of the second touch electrode 20 are deposited, and thus extend into the via holes to form conductive vias, realizing the electrical connection between the electrode sections of the second touch electrode 20 and the connecting section 23.

In order to further simplify the manufacturing method of the touch panel, for example, as shown in FIG. 6, the edge of the connecting section 23 in the widthwise direction W of the first touch electrode 10 goes beyond the edge of the first insulating section 51 in the same direction W. In this way, a part of the first electrode section 21 can be electrically connected to the part of the connecting section 23 that is beyond the first insulating section 51 and on the same side as the first electrode section 21, and a part of the second electrode section 22 can be bonded to the part of the connecting section 23 that is beyond the first insulating section 51 and on the same side as the second electrode section 22. In this case, the bonding of the first electrode section 21 and the connecting section 23 achieves electrical connection therebetween and the bonding of the second electrode section 22 and the connecting section 23 achieves electrical connection therebetween, so that the second touch electrode 20 is formed. Since no via holes are formed for conduction in the structure in FIG. 6, a simpler manufacturing method can be used to fabricate the structure.

It is understandable that the touch panel provided in at least one embodiment of the present invention further includes a transparent base substrate, on which the above-mentioned first touch electrodes 10, the second touch electrodes 20 and the insulating elements 50 are provided.

At least one embodiment of the present invention provides a manufacturing method of a touch panel. The manufacturing method includes the following steps:

forming a pattern including a connecting section 23;

forming a pattern including an insulating element 50 (see FIG. 7*a*), the insulating element 50 including the first insulating section 51 and the second insulating section 52 protruding from the first insulating section 51; and forming a pattern including the electrode section and the first touch electrode 10, wherein the electrode section includes the first electrode section 21 and the second electrode section 22, which are electrically connected by the connecting section so as to form the second touch electrode 20; the first insulating section 51 is located between the connecting section and the first touch electrode 10, and the second insulating section 52 is located between the first electrode section 21 and the first touch electrode 10 and also between the second electrode section 22 and the first touch electrode 10.

As described above, since the insulating element 50 can be formed through one step of patterning process, the manufacturing method provided in at least one embodiment of the present invention is relatively simple.

In at least one embodiment of the present invention, the process, during which the connecting section is formed, is subject to no particular limitation. For example, the connecting section can be formed by any kind of patterning process, such as printing, transfer printing, photolithography, etc.

When the connecting sections are formed by a traditional patterning process of photolithography, the following steps are included: forming a layer of electrode material on a base substrate; applying a layer of photoresist onto the layer of electrode material; exposing and developing the layer of photoresist with a mask plate; and forming a pattern including the connecting section through etching. The layer of electrode material can be formed on the base substrate in any manner, such as deposition, vaporization, etc.

Similarly, the pattern including the electrode section and the first touch electrode 10 can be formed by any kind of patterning process, such as printing, transfer printing, photolithography, etc.

As described above, the connecting section 23 may be electrically connected with the electrode sections 21, 22 through via holes. In order to further simplify the manufacturing method, for example, the edge of the connecting section 23 in the widthwise direction of the first touch electrode 10 goes beyond the edge of the first insulating section 51 also in the widthwise direction of the first touch electrode 10, so that a part of the first electrode section 21 is electrically connected to the part of the connecting section 23 that is beyond the first insulating section 51 and on the same side as the first electrode section 21, and a part of the second electrode section 22 is electrically connected to the part of connecting section 23 that is beyond the first insulating section 51 and on the same side as the second electrode section 22.

In order to simplify the manufacturing method, for example, the insulating element 50 can be formed with a halftone mask plate. In at least one embodiment of the present invention, the insulating element 50 can be formed in one and the same step of photolithographic process, and in this case a halftone mask plate is needed to form the insulating element 50. The part of the halftone mask plate corresponding to the second insulating section has optical transmittance different from that of the part of the halftone mask plate corresponding to the first insulating section 51.

For example, the step for forming the pattern including the insulating element 50 includes: forming a layer of insulating material, which may has a width, for example, from 1 to 3 μm; applying photoresist onto the layer of insulating material; and exposing and developing the photoresist with a halftone mask plate so as to form a pattern corresponding to the insulating element 50 in the layer of photoresist after exposure; the halftone mask plate includes a transparent area, an opaque area, and a partially transparent area, the opaque area corresponds to the second insulating section 52, the partially transparent area corresponds to the first insulating section 51, and a rest part of the halftone mask plate other than the opaque area and the partially transparent area is the transparent area.

As described above, the layer of insulating material is made of a transparent resin material.

A layer of electrode material is deposited after the insulating element 50 is formed. The part of the layer of electrode material corresponding to the electrode section is directly bonded to the part of the connecting section beyond the insulating element 50, so that the electrode section and the connecting section can be electrically connected immediately after the electrode section and the first touch electrode 10 are formed by a patterning process, omitting the step for forming via holes.

In the following, the step for forming the pattern including the electrode section and the first touch electrode 10 by a photolithographic process will be described. For example, forming the pattern including the electrode section and the first touch electrodes 10 include the following steps:

forming a layer C of electrode material (FIG. 7b) covering the insulating element 50 (for brevity and clarity, for example, only the second insulating section 52 protruding on the left side of the insulating element 50 shown in FIG. 6 is shown in the drawing while the first insulating section 51 and the second insulating section 52 protruding on the right side are omitted);

forming a layer D of photoresist (FIG. 7c) covering the layer C of electrode material;

exposing and developing the layer D of photoresist (FIG. 7d) so as to form the pattern corresponding to the first touch electrode 10 and the pattern corresponding to the electrode section; and etching the electrode material according to the pattern corresponding to the first touch electrode 10 and the pattern corresponding to the electrode section formed in the layer D of photoresist so as to form the first touch electrode 10 and the electrode section 21 (FIG. 7e).

The structure shown in FIG. 7f will be achieved after the remaining photoresist is stripped off.

As described above, the layer C of electrode material can be made of a transparent electrode material or a nontransparent electrode material (e.g., a metallic material). When the layer C of electrode material is made of a metallic material, the first touch electrode 10 and the second touch electrode 20 should be overlapped with the black matrix in the display panel used in cooperation with the touch panel.

Figure 9:
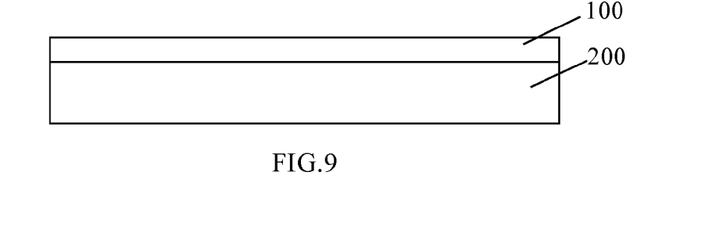
FIG. 9 is a schematic diagram of a display device according to an embodiment of the present invention.

At least one embodiment of the present invention provides a display device, as shown in FIG. 9, including a display panel 200 and a touch panel 100 disposed on the light-emitting surface of the display panel 200, and the touch panel 100 is any of the above-mentioned touch panels provided in at least one embodiment of the present invention.

Since the manufacturing method of the touch panel is relatively simple, the costs of the touch panel are relatively small. The display device may be a cell-phone, a tablet computer or other electronic device.

In order to reduce the overall thickness of the display device, for example, the upper substrate of the display panel is integrated with the base substrate of the touch panel. That is, the first touch electrodes, the second touch electrodes and the insulating elements are fabricated on the upper substrate of the display panel, in the process when the touch panel is fabricated.

What are described above is related to the illustrative embodiments of the disclosure only and not limitative to the scope of the disclosure; the scopes of the disclosure are defined by the accompanying claims.

The present application claims priority of China patent application No. 201410419265.5 filed on Aug. 22, 2014, which is incorporated herein by reference in its entirety as a part of the present application.

The invention claimed is:

1. A touch panel comprising a first touch electrode, a second touch electrode and a one-piece insulating element therebetween, wherein the first touch electrode and the second touch electrode are disposed intersecting with each other and insulated from each other, and the second touch electrode comprises an electrode section disposed in a same layer as the first touch electrode and a connecting section disposed on a different layer and spaced apart from the electrode section, the electrode section comprises a first electrode section on one side in a widthwise direction of the first touch electrode and a second electrode section on the other side in the widthwise direction, the first and second electrode sections are electrically connected by the connecting section, and the connecting section is spaced apart from the first touch electrode, and the one-piece insulating element comprises a first insulating section between the connecting section and the first touch electrode and a second insulating section between the first electrode section and the first touch electrode and also between the second electrode section and the first touch electrode; and a side surface of the second insulating section close and opposite to the first touch electrode is not in contact with the first touch electrode.

2. The touch panel according to claim 1, wherein an edge of the connecting section in the widthwise direction of the first touch electrode goes beyond an edge of the first insulating section in the widthwise direction, a part of the first electrode section is electrically connected to a part of the connecting section beyond the first insulating section and on a same side as the first electrode section, and a part of the second electrode section is electrically connected to a part of the connecting section beyond the first insulating section and on a same side as the second electrode section.

3. A display device comprising a display panel and a touch panel disposed on a light-emitting surface of the display panel, wherein the touch panel is the touch panel according to claim 1.

4. The touch panel according to claim 1, wherein a side surface of the second insulating section close to the first electrode section is not in contact with the first electrode section.

5. The touch panel according to claim 1, wherein a side surface of the second insulating section close to the second electrode section is not in contact with the second electrode section.

6. A manufacturing method of a touch panel, the method comprising:
- forming a pattern comprising a connecting section;
- forming a pattern comprising an insulating element, the insulating element comprising a first insulating section and a second insulating section protruding from the first insulating section; and
- forming a pattern comprising an electrode section and a first touch electrode,
- wherein the electrode section comprises a first electrode section and a second electrode section, which are electrically connected by the connecting section so as to form a second touch electrode; the first insulating section is between the connecting section and the first touch electrode, and the second insulating section is between the first electrode section and the first touch electrode and also between the second electrode section and the first touch electrode, and
- a side surface of the second insulating section close and opposite to the first touch electrode is not in contact with the first touch electrode.

7. The manufacturing method of a touch panel according to claim 6, wherein an edge of the connecting section in a widthwise direction of the first touch electrode goes beyond an edge of the first insulating section in the widthwise direction, so that a part of the first electrode section is electrically connected to a part of the connecting section beyond the first insulating section and on the same side as the first electrode section, and a part of the second electrode section is electrically connected to a part of the connecting section beyond the first insulating section and on the same side as the second electrode section.

8. The manufacturing method of a touch panel according to claim 6, wherein forming of a pattern comprising an insulating element comprises:
- forming a layer of insulating material;
- applying photoresist onto the layer of insulating material; and
- exposing and developing the photoresist with a halftone mask plate so as to form a pattern corresponding to the insulating element in a layer of photoresist after exposure,
- wherein the halftone mask plate comprises a transparent area, an opaque area, and a partially transparent area, the opaque area corresponds to the second insulating section, the partially transparent area corresponds to the first insulating section, and a rest part of the halftone mask plate other than the opaque area and the partially transparent area is the transparent area.

9. The manufacturing method of a touch panel according to claim 8, wherein the layer of insulating material is made of a transparent resin material.

10. The manufacturing method of a touch panel according to claim 6, wherein forming of the pattern comprising the electrode section and the first touch electrode comprises:
- forming a layer of electrode material covering the insulating element;
- forming a layer of photoresist covering the layer of electrode material;
- exposing and developing the layer of photoresist so as to form the pattern corresponding to the first touch electrode and the patter corresponding to the electrode section; and
- etching the layer of electrode material according to the pattern corresponding to the first touch electrode and the pattern corresponding to the electrode section formed in the layer of photoresist so as to form the first touch electrode and the electrode section.

11. The manufacturing method of a touch panel according to claim 10, wherein the layer of electrode material is made of a transparent electrode material.

12. The display device according to claim 3, wherein an upper substrate of the display panel is integrated with the base substrate of the touch panel.

13. The display device according to claim 3, wherein an edge of the connecting section in the widthwise direction of the first touch electrode goes beyond an edge of the first insulating section in the widthwise direction, a part of the first electrode section is electrically connected to a part of the connecting section beyond the first insulating section and on a same side as the first electrode section, and a part of the second electrode section is electrically connected to a part of the connecting section beyond the first insulating section and on a same side as the second electrode section.

14. The display device according to claim 13, wherein an upper substrate of the display panel is integrated with the base substrate of the touch panel.

15. The manufacturing method of a touch panel according to claim 7, wherein forming of a pattern comprising an insulating element comprises:
- forming a layer of insulating material;
- applying photoresist onto the layer of insulating material; and
- exposing and developing the photoresist with a halftone mask plate so as to form a pattern corresponding to the insulating element in a layer of photoresist after exposure,
- wherein the halftone mask plate comprises a transparent area, an opaque area, and a partially transparent area, the opaque area corresponds to the second insulating section, the partially transparent area corresponds to the first insulating section, and a rest part of the halftone mask plate other than the opaque area and the partially transparent area is the transparent area.

16. The manufacturing method of a touch panel according to claim 15, wherein the layer of insulating material is made of a transparent resin material.

17. The manufacturing method of a touch panel according to claim 7, wherein forming of the pattern comprising the electrode section and the first touch electrode comprises:
- forming a layer of electrode material covering the insulating element;
- forming a layer of photoresist covering the layer of electrode material;
- exposing and developing the layer of photoresist so as to form the pattern corresponding to the first touch electrode and the pattern corresponding to the electrode section; and
- etching the layer of electrode material according to the pattern corresponding to the first touch electrode and the pattern corresponding to the electrode section formed in the layer of photoresist so as to form the first touch electrode and the electrode section.

18. The manufacturing method of a touch panel according to claim 17, wherein the layer of electrode material is made of a transparent electrode material.

19. The manufacturing method of a touch panel according to claim 6, wherein forming of the pattern comprising the electrode section and the first touch electrode comprises:
- forming a layer of electrode material covering the insulating element;
- forming a layer of photoresist covering the layer of electrode material;

exposing and developing the layer of photoresist so as to form a first photoresist pattern corresponding to the first touch electrode and a second photoresist pattern corresponding to the electrode section, a height of the first and second photoresist pattern relative to the base substrate is lower than that of a part of the layer of electrode material which is located on the second insulating section relative to the base substrate; and etching the layer of electrode material according to the first photoresist pattern corresponding to the first touch electrode and the second photoresist pattern corresponding to the electrode section formed in the layer of photoresist so as to form the first touch electrode and the electrode section.

\* \* \* \* \*